United States Patent
Waffenschmidt et al.

(10) Patent No.: US 8,866,480 B2
(45) Date of Patent: Oct. 21, 2014

(54) INDUCTIVELY POWERED ELECTRIC COMPONENT OF AN MRI APPARATUS

(75) Inventors: Eberhard Waffenschmidt, Aachen (DE); Achim Hilgers, Alsdorf (DE); Lambertus De Vries, Overpelt (BE); Bjoern Weissler, Aachen (DE); Derk Reefman, Eindhoven (NL); Marinus Johannes Adrianus Maria Van Helvoort, Leende (NL); Pieter Gerrit Blanden, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 664 days.

(21) Appl. No.: 12/997,009

(22) PCT Filed: Jun. 15, 2009

(86) PCT No.: PCT/IB2009/052537
§ 371 (c)(1),
(2), (4) Date: Dec. 9, 2010

(87) PCT Pub. No.: WO2009/153727
PCT Pub. Date: Dec. 23, 2009

(65) Prior Publication Data
US 2011/0084694 A1    Apr. 14, 2011

(30) Foreign Application Priority Data
Jun. 20, 2008  (EP) .................................... 08158649

(51) Int. Cl.
*G01V 3/00*        (2006.01)
*G01R 33/28*       (2006.01)
*G01R 33/36*       (2006.01)
*G01R 33/422*      (2006.01)

(52) U.S. Cl.
CPC .......... *G01R 33/3692* (2013.01); *G01R 33/283* (2013.01); *G01R 33/3642* (2013.01); *G01R 33/422* (2013.01)
USPC ......................................................... 324/318

(58) Field of Classification Search
USPC .................................................. 324/300–322
See application file for complete search history.

(56) References Cited

U.S. PATENT DOCUMENTS

| 5,534,108 | A  | * | 7/1996  | Qian et al. ...................... 216/68 |
| 7,211,986 | B1 |   | 5/2007  | Flowerdew et al. |
| 7,309,989 | B2 |   | 12/2007 | Boskamp et al. |

(Continued)

FOREIGN PATENT DOCUMENTS

| DE | 102006060036 A1 | 6/2008 |
| WO | 2004089211 A2   | 10/2004 |
| WO | 2005106901 A2   | 11/2005 |
| WO | 2006067682 A1   | 6/2006 |

*Primary Examiner* — Melissa Koval
*Assistant Examiner* — Daniel Miller

(57) ABSTRACT

The invention relates to a nuclear magnetic resonance imaging apparatus comprising: a main magnet (122) adapted for generating a main magnetic field; at least one radio frequency receiver coil unit (144) for acquiring magnetic resonance signals in a receiver coil radio frequency band (202) from an examined object (124); means (140) for inductively (wirelessly) supplying electric power to an electric component of the apparatus, wherein the electric component is adapted to be powered by inductively supplied electric power, wherein the power transfer frequency (200) and the higher-harmonics (206) of the power transfer frequency (200) for inductively supplying the electric power are located outside the receiver coil radio frequency band (202).

12 Claims, 5 Drawing Sheets

(56) References Cited

U.S. PATENT DOCUMENTS

| | | | |
|---|---|---|---|
| 2003/0227289 A1* | 12/2003 | Heid et al. | 324/314 |
| 2004/0113790 A1* | 6/2004 | Hamel et al. | 340/572.1 |
| 2006/0226841 A1* | 10/2006 | Boskamp et al. | 324/322 |
| 2007/0013376 A1 | 1/2007 | Heid et al. | |
| 2008/0231276 A1* | 9/2008 | Diehl et al. | 324/314 |
| 2008/0231279 A1* | 9/2008 | Iwadate | 324/318 |
| 2008/0298100 A1* | 12/2008 | Esaka et al. | 363/67 |
| 2009/0276639 A1* | 11/2009 | Saha et al. | 713/300 |

* cited by examiner

INDUCTIVELY POWERED ELECTRIC COMPONENT OF AN MRI APPARATUS

TECHNICAL FIELD

The invention relates to a nuclear magnetic resonance imaging apparatus, a nuclear magnetic resonance imaging receiving coil, a method of performing nuclear magnetic resonance imaging of an object, a method of acquiring magnetic resonance image signals and a computer program product.

BACKGROUND AND RELATED ART

Magnetic resonance imaging (MRI) is a state of the art imaging technology which allows cross sectional viewing of objects like the human body with unprecedented tissue contrast. MRI is based on the principles of nuclear magnetic resonance (NMR), a spectroscopic technique used by scientists to obtain microscopic chemical and physical information about molecules. The basis of both NMR and MRI is the fact, that atomic nuclei with non-zero spin have a magnetic moment. In medical imaging, usually nuclei of hydrogen atoms are studied since they are present in the body in high concentrations like for example water. The nuclear spin of elementary particles can resonate at a resonance frequency, if a strong DC magnetic field is applied. This magnet resonance (MR) frequency is determined by the level of the magnetic flux. In an MRI scanner, the magnetic field matches a selected resonance frequency only at one position in space. Only at this position the presence of these particles can be detected. By varying this position step-by-step, an image can be measured. In practice, more sophisticated algorithms are used to achieve the image in a reasonable time from e.g. 'slices' of the investigated volume. Typical resonance frequencies are in the range from 40 MHz to 120 MHz, corresponding to magnetic flux levels in the range of 1 T to 3 T.

The needed strong DC magnet field ($B_0$ field) is typically generated by superconducting magnets. In order to vary this field, such that it matches a given radio frequency only at one position, a field gradient is generated using gradient coils. The field gradient can vary over time to achieve a scan. The frequency range in the gradient coils is low, and reaches up to a maximum of 10 kHz.

To excite nuclear resonances, the RF coil generates a high frequency magnetic field at the nuclear resonance. The magnetic field must direct in radial direction with respect to the axis of the MRI scanner. To achieve a radial magnetic field in all directions, a rotating field is used, which points in any radial direction at one point of time during one period. This is achieved by using a so called 'birdcage' arrangement. Currents in opposing slabs of the bird cage flow in opposing direction and thus generate a radial field. Currents in neighbored slabs have a phase shift, such that a field rotates.

To measure nuclear resonances, "sensor" or "receiver" coils are placed close to the region of interest, e.g. on the patient. These coils must be oriented such that their axis points approximately in radial direction with respect to the axis of the MRI scanner. Often, a number of sensor coils are connected to a complete module, e.g. such a module may consist of 4×4 individual sensor coils. The module also includes additional electronics to process the measured signals.

The sensor coil modules are typically connected to the MRI system by cables. However, the usage of cables to connect the coil modules to the MRI system has various disadvantages. For example, the comparably stiff cables may be the cause for an unwanted displacement of the modules during movement of the patient. Furthermore, in some cases common mode currents may be induced in the cables which deteriorate the image quality and even may cause harm to the patient. Therefore, it is advantageous to omit the cables.

For example, WO 2006/06768282 discloses a device for performing magnetic resonance imaging of a body, wherein power is provided to sensor coils wirelessly. The power is transmitted by magnetic induction. Transmitter coils, which are integrated in the MRI tube, generate an alternating magnetic field. The power receiver coils are integrated in the sensor coil module. The alternating magnetic field induces a voltage in the power receiver coil, which is used to power the module.

However, there may arise the problem that unwanted disturbances of the sensor coils may occur since the sensor coils are extremely sensitive against any disturbances in the RF (radio frequency) range around the MR frequency.

Therefore there is a need for an improved nuclear magnetic resonance imaging apparatus, an improved nuclear magnetic resonance imaging receiving coil, an improved method of performing nuclear magnetic resonance imaging, an improved method of acquiring magnetic resonance imaging signals in a receiver coil and an improved computer program product, which overcomes the before mentioned problems.

SUMMARY OF THE INVENTION

The present invention provides a nuclear magnetic resonance imaging apparatus comprising a main magnet adapted for generating a main magnetic field, at least one radio frequency receiver coil unit for acquiring magnetic resonance signals in a receiver coil radio frequency band from an examined object, and means for inductively supplying electric power to an electric component of the apparatus, wherein the electric component is adapted to be powered by inductively supplied electric power, wherein the power transfer frequency and the frequencies of the higher harmonics of the power transfer frequency for inductively supplying the electric power are located outside the receiver coil radio frequency band.

In other words, the power transfer frequency is selected such that it is high enough such that the frequency distance of the higher harmonic peaks are larger than the frequency bandwidth of the receiver coil radio frequency band and such that any multiple of the power transfer frequency does not fall into the receiver coil radio frequency band.

This has the advantage that in the frequency band, which is used for acquisition of magnetic resonance imaging signals, no disturbances due to the inductively supplied electric power occur. This allows avoiding excessive filtering of the higher harmonics of the power transfer frequency. Hence, disturbances due to improper selection of the operating frequency of the inductive power transfer system are avoided.

In accordance with an embodiment of the invention, the electric component is the radio frequency receiver coil unit itself. However, the invention is not limited to the electric component being the RF coil unit itself. The electric component can be any kind of electronic device which is operated in close vicinity of the MR scanner.

Depending on the reception area in which the MR receiving coil is sensitive to external disturbances in the RF coil frequency band, the electric component may be spatially located within the magnet bore of the main magnet, or the electric component may be located even outside the magnet bore. However, this strongly depends on the RF coil sensitivity and the RF power used for inductively providing the electric power to the electric component.

Thus, almost any kind of electrical device may be inductively powered, wherein the used power transfer frequency and the frequencies of the higher harmonics of the power transfer frequency for inductively supplying the electric power are located outside the receiver coil radio frequency bandwidth. This includes electronic devices like any kinds of sensor like ECG/VCG-sensors, $SpO_2$, respiratory and other physiology sensors used for example for patient monitoring, but also sensors for scan triggering devices. Other electric components may be in-bore cameras and head-up displays located in close vicinity of the bore or within the magnet bore itself.

It has to be mentioned here, that preferably the electric component is a low power device, i.e. a device with a total power consumption below 300 W.

In accordance with an embodiment of the invention, the apparatus further comprises means for determining at least one flanking frequency of the actually supplied higher harmonics of the power transfer frequency flanking the receiver coil radio frequency band, wherein the apparatus further comprises means for adjusting the power transfer frequency using said determined flanking frequency. Either, a calibration procedure can be applied to determine the relative position of the higher harmonics neighboring the receiver coil radio frequency band or a feedback loop can be used which continuously controls the operating frequency using for example a phase locked loop (PLL) circuit. According to the control signal detected by means of the PLL circuit, the power transfer frequency can be varied accordingly such that the detected higher harmonics of the power transfer frequency are always located outside the receiver coil radio frequency band.

In accordance with a further embodiment of the invention, the means for inductively supplying the electric power are adapted for supplying the electric power to the radio frequency receiver coil unit at time slices unused for magnetic resonance signal acquisition by the radio frequency unit.

This further allows avoiding a negative impact of the inductive power transfer on the image quality. Such a time multiplexing method is based on the insight that the MRI system in many cases does not always perform measurements of the nuclear resonances. During a complete MR scan there are always times when the gradient field changes to a new distribution and settles there. During these times, inductive power can be transferred without any impact on the image quality, since no MR measurements are performed. Thus, during transitions of the gradient field the inductive power system is switched on. Accordingly, during the MR resonance measurements the inductive power transfer is switched off. In order to further provide continuous energy within the electric component at the time slices used for magnetic resonance signal acquisition, additional energy storage by means of for example rechargeable batteries, capacitors etc can be used which are charged during said transitions of the gradient field when the inductive power system is switched on.

It has to be noted here, that the time multiplexing method can also be used as stand-alone method without special requirements regarding a selection of the higher harmonics frequencies since magnetic resonance signal acquisition by the radio frequency unit is not performed when inductively supplying the electric power to the electric component.

In accordance with a further embodiment of the invention, the apparatus further comprises means for wirelessly receiving the acquired magnetic resonance signals from the receiver coil unit, preferably in combination with the feature that the receiver coil unit is inductively electrically powered. This has the advantage, that any kind of cables to connect the receiving coil unit to the MRI apparatus can be avoided. For example, an ultra wide band communication channel can be used for communication between the receiver coil unit and the MRI system.

In another aspect, the invention relates to an electric component of a nuclear magnetic resonance imaging apparatus, the apparatus comprising a nuclear magnetic resonance imaging receiver coil unit for acquiring magnetic resonance signals in a receiver coil radio frequency band from an examined object, the electric component comprising means for inductively receiving electric power, wherein the power transfer frequency and the higher harmonics of the power transfer frequency are located outside the receiver coil radio frequency band.

In accordance with an embodiment of the invention, the means for inductively receiving electric power comprise a first coil adapted for inductively receiving the electric power, wherein the receiving coil unit further comprises a second coil adapted for receiving the magnetic resonance imaging signals, wherein the first and the second coil are overlapping for a mutual electromagnetically decoupling of the first and the second coil.

In case the coils would not be overlapping, due to the circular run of closed magnetic field lines one coil would always be penetrated by magnetic field lines generated by the other coil in such a manner, that the magnetic field lines always point only in one given direction for that coil. Thus, continuously a current may be induced due to the field lines which current may be disturbing for said coil. In contrast, by overlapping the first and the second coil, magnetic field lines induced by the first coil are penetrating through the second coil in the overlapping region in a first direction, whereas outside the overlapping region the magnetic field lines generated by the first coil are penetrating through the second coil in a direction opposite to the mentioned penetration direction. Thus, induced currents are compensated within the second coil. This allows for an effective decoupling of the first and the second coil and thus reduces unwanted signals induced in any of the coils.

In accordance with an embodiment of the invention, the means for inductively receiving electric power comprise a set of coils adapted for inductively receiving the electric power, wherein each coil of the set of coils comprise a different number of coil windings. This has the advantage that different output voltages can be obtained in the receiving coil unit, which reduces the number of electronic components needed for power conversion, which may also induce further disturbances to the receiving coil unit.

For example, the primary inductive power source may provide power up to 300 W, wherein on the secondary side the power take up per means for inductively receiving electric power is only 30 W. In this case, multiple secondary coils can be used with a single source, theoretically 10*30 W.

In accordance with an embodiment of the invention, the receiving coil unit further comprises means for wirelessly transmitting the acquired magnetic resonance signals.

In another aspect, the invention relates to a nuclear magnetic resonance imaging apparatus comprising a main magnet adapted for generating a main magnetic field, at least one radio frequency receiver coil unit for acquiring magnetic resonance signals in a receiver coil radio frequency band from an examined object, and means for inductively supplying electric power to an electric component of the apparatus, wherein the electric component is powered by inductively supplied electric power. The means for inductively supplying the electric power are adapted for supplying the electric power by a rotating magnetic field, wherein the rotation axis of the rotating magnetic field is parallel with the cylindrical axis of the main magnet. For example, the means for inductively supplying the electric power may comprise a set of transmitter coils, wherein the windings of each transmitter coil of the set of transmitter coils span a plane, wherein all spanned planes of the set of transmitter coils intersect with a common axis, wherein said axis is parallel with the cylindrical axis of the main magnet.

This has the effect, that a rotating, radial field can be generated, wherein the rotation axis is in line with the axis of the MRI tube. Thus, the plane defined by the coil windings used for inductively receiving the electric power of the receiving coil unit can be oriented parallel to the axis of the MRI tube, but with the radial angle of the plane being arbitrarily selectable with respect to the radial direction of the MRI tube. This is especially suitable in case the electric component is constituted by the RF coil unit itself. However, as already mentioned above, the electric component can be constituted by any kind of sensor, display unit etc.

For example, a receiving coil unit for acquiring magnetic resonance signals can be positioned in the MRI tube on the object to be imaged without the need to find exactly a most suitable relative orientation of the receiving coil unit and the MRI tube in order to obtain a maximum induction of electric power in the receiving coil unit. In case, the alternating magnetic field used for supplying the electric power to the receiver coil unit would be a static and thus not a rotating field, the receiver coil unit induction reception coil necessarily would need to be oriented with its plane perpendicularly to said magnetic field direction. Any deviation from said direction would reduce the number of magnetic field lines penetrating the induction reception coil and therefore reduce the induced current in said coil. By using a rotating radial field for electric power induction, a maximum induction can be obtained at any arbitrary orientation of the axis perpendicularly to the induction receiving coil in any radial direction of the MRI tube.

The special arrangement of coils provides the further advantage, that the electric component, especially a receiver coil unit can be inductively powered over the complete crosssection of the MRI tube. This is an important aspect since depending on the imaged object position, size of the imaged object etc., the receiver coil unit will be located within the MRI tube at almost any arbitrary spatial position. By combining the features of the rotating magnetic fields, was well as the set of transmitter coils, wherein the windings of each transmitter coil of the set of transmitter coils span a plane, wherein all spanned planes of the set of transmitter coils intersect with a common axis, wherein said axis is parallel with the cylindrical axis of the main magnet, an operator of the MRI system is completely free to position the receiver coil unit at any arbitrary position and orientation on an imaged object within the MR bore.

In another aspect, the invention relates to a method of performing nuclear magnetic resonance imaging of an object, the method being performed by a nuclear magnetic resonance imaging apparatus, the method comprising exciting nuclear magnetization within the object, inductively supplying electric power to an electric component of the apparatus, wherein the electric component is powered by inductively supplied electric power, the apparatus comprising a radio frequency receiver coil unit, the radio frequency receiver coil unit being adapted for acquiring magnetic resonance signals in a receiver coil radio frequency band from the object upon excitation of the object, wherein the power transfer frequency and the higher harmonics of the power transfer frequency for inductively supplying the electric power are located outside the receiver coil radio frequency band. The method further comprises receiving the acquired magnetic resonance signals from the receiver coil unit.

In accordance with an embodiment of the invention, the method further comprises determining at least one flanking frequency of the actually supplied higher harmonics of the power transfer frequency flanking the receiver coil radio frequency band, wherein the method further comprises adjusting the power transfer frequency using said determined flanking frequency.

In another aspect, the invention relates to a method of acquiring magnetic resonance imaging signals in a receiver coil radio frequency band from an examined object, the method comprising inductively receiving electric power, wherein the power transfer frequency and the higher harmonics of the power transfer frequency are located outside the receiver coil radio frequency band. The method further comprises acquiring the magnetic resonance signals from the examined object and transmitting the acquired magnetic resonance signals to a nuclear magnetic resonance imaging apparatus.

In another aspect, the invention relates to a computer program product comprising computer executable instructions to perform the method of performing nuclear magnetic resonance imaging of an object according to the invention and/or to perform the method of acquiring magnetic resonance imaging signals from an examined object according to the invention.

BRIEF DESCRIPTION OF THE DRAWINGS

In the following preferred embodiments of the invention are described in greater detail by way of example only making reference to the drawings in which.

DETAILED DESCRIPTION

Figure 1:
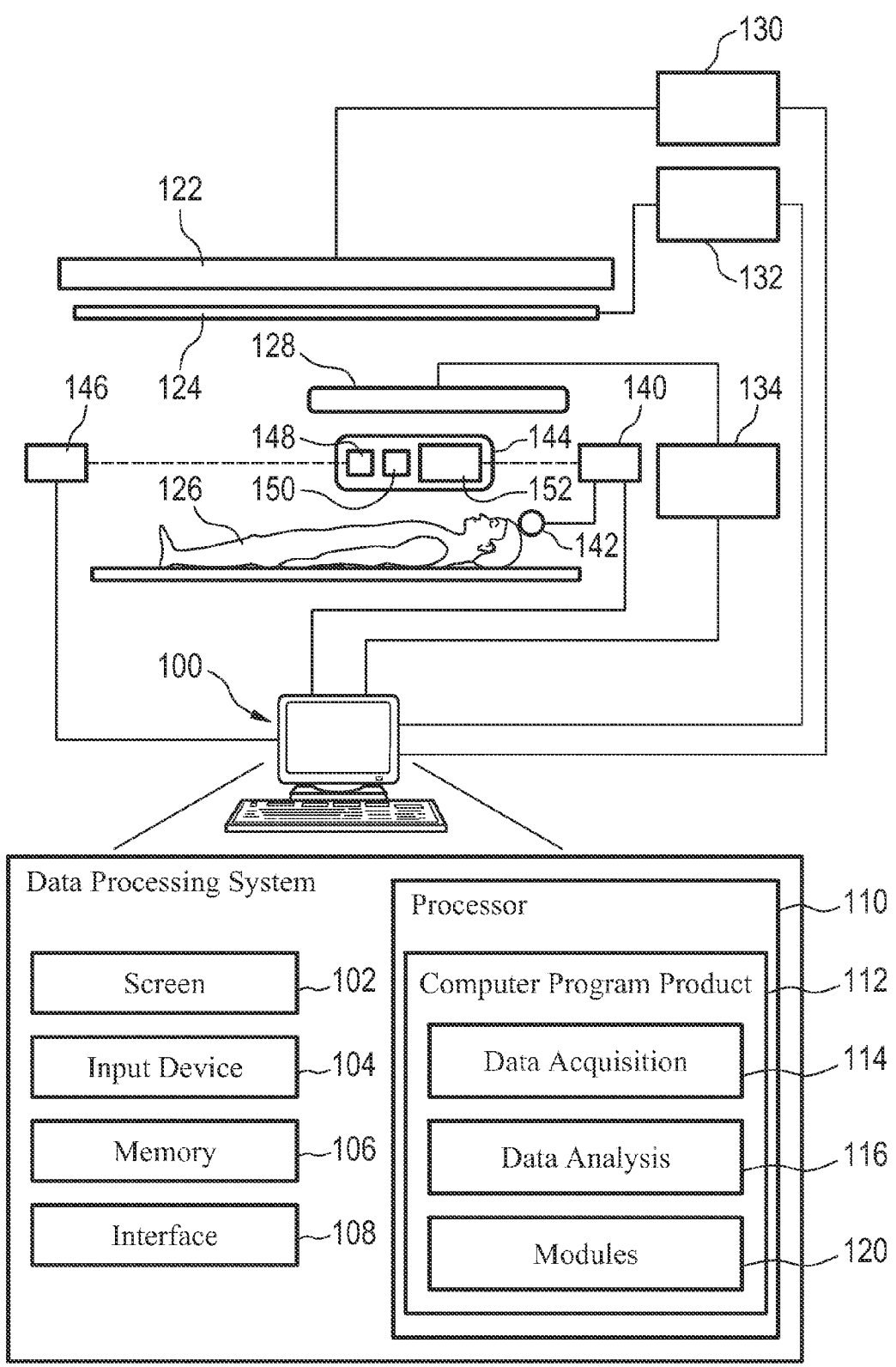
FIG. 1 is a schematic illustrating an MRI system according to the invention.

In the following similar elements are depicted by the same reference numerals.

FIG. 1 is a schematic illustrating an MRI system according to the invention. Only major components of a preferred MRI system which incorporate the present invention are shown in FIG. 1. The magnetic resonance imaging apparatus comprises a data processing system 100, wherein the data processing system 100 typically comprises a computer screen 102 and an input device 104. Such an input device could be for example a keyboard or a mouse. The MRI system further comprises a memory 106 and an interface 108. The interface 108 is adapted for communication and data exchange with typical hardware MRI components.

Typical hardware MRI components are for example a main field control unit 130 adapted for controlling the main field of the magnet 122. The interface 108 is also adapted to communicate with the gradient coil unit 132, wherein respective gradient coils 124 are preferably self shielded gradient coils for producing gradients along three mutual axis x, y and z.

The MRI system further comprises an RF transmitter coil 128 electrically connected to an RF coil unit 134. In general, the RF coil 128 is adapted for transmission of an RF pulse.

By means of an RF generator, an RF pulse sequence is generated under the control of data processing system 100 and for example protons $^1$H in the body 126 of a person are excited in a predefined manner. The resulting magnetic resonance imaging signal is then detected by for example a surface coil unit 144. The surface coil unit 144 comprises a reception coil for acquiring the magnetic resonance imaging signal and a transmitter 148 by which wirelessly the acquired RF signal is transmitted to a receiving unit 146 connected to the data processing system 100. In general, the processing of the acquired RF signal can be performed by special hardware components like detectors, mixers, etc well known in the art and not shown here. Such hardware components can be adapted as additional external hardware units or be implemented into the data processing system 100 or also be at least partially implemented in the surface coil unit 144.

The coil unit 144 is electrically powered by a coil unit 140 which is adapted for inductively supplying electric power to the coil unit 144. For this purpose, the coil unit 144 further comprises an induction reception coil 152. Further, the coil unit 144 comprises energy storage means 150 which can for example be used in case time multiplexing is used, which as already described above means that only during transitions of the gradient fields the inductive power system is switched on.

Further shown in FIG. 1 is a sensor 142 which allows for detection of higher harmonics of the power transfer frequency used for inductively supplying electric power to the coil unit 144. Thereby, the sensor 142 operates in the range of the radio frequency band used for acquisition of magnetic resonance signals by the coil unit 144. For example, actually supplied higher harmonics of the power transfer frequency which flank the receiver coil radio frequency band are detected by means of the sensor 142, analyzed by either the transmitter module 140 or a respective computer program product module 120 of the data processing system 100 in order to adjust the power transfer frequency in such a manner that any multiple of the operating frequency does not fall into the frequency range in which the receiver coil is operating, i.e. in the frequency range around the resonances of the actually detected nuclear spins.

It has to be noted, that the hardware MRI components may further comprise numerous electrical components which may be inductively electrically powered, wherein the used power transfer frequency and the frequencies of the higher harmonics of the power transfer frequency for inductively supplying the electric power are located outside the receiver coil unit 144 radio frequency bandwidth. For example, ECG/VCG-sensors, $SpO_2$, respiratory and other physiology sensors may be positioned on the patient 126 within the magnet bore. Similarly to the receiver coil unit 144, these sensors may also be adapted to wirelessly provide information to the data processing system 100. Further, these sensors may comprise energy storage means which can for example be used in case time multiplexing is used.

Further, in-bore cameras and head-up displays located within the magnet bore itself may be inductively powered and data exchange between the data processing system 100 may also be preferably performed wirelessly. This allows for a comfortable patient monitoring, but also provides enhanced comfort to the patient: in state of the art MR systems only acoustic entertainment is provided to patients by for example headphones. By means of a head-up display, also short movies etc. may be displayed to the patient such that he feels much more comfortable. Also, head-up displays may be used to instruct the patient for several physical examination procedures which includes for example instructions for MRI-breath hold techniques or display of a leftover examination time.

The data processing system 100 further comprises a processor 100 which is adapted to execute computer executable instructions of the computer program product 112. In the present embodiment, the data processing system 100 comprises a computer program product 112 by means of a data acquisition module 114 which is adapted to control the above described hardware units. Data acquisition is performed and the acquired MR data is analyzed via the data analysis module 116. As already described above, the computer program product 112 further comprises various modules 120, like for example modules controlling the power transfer frequency for inductively supplying the electric power to the reception coil unit 144.

Figure 2:
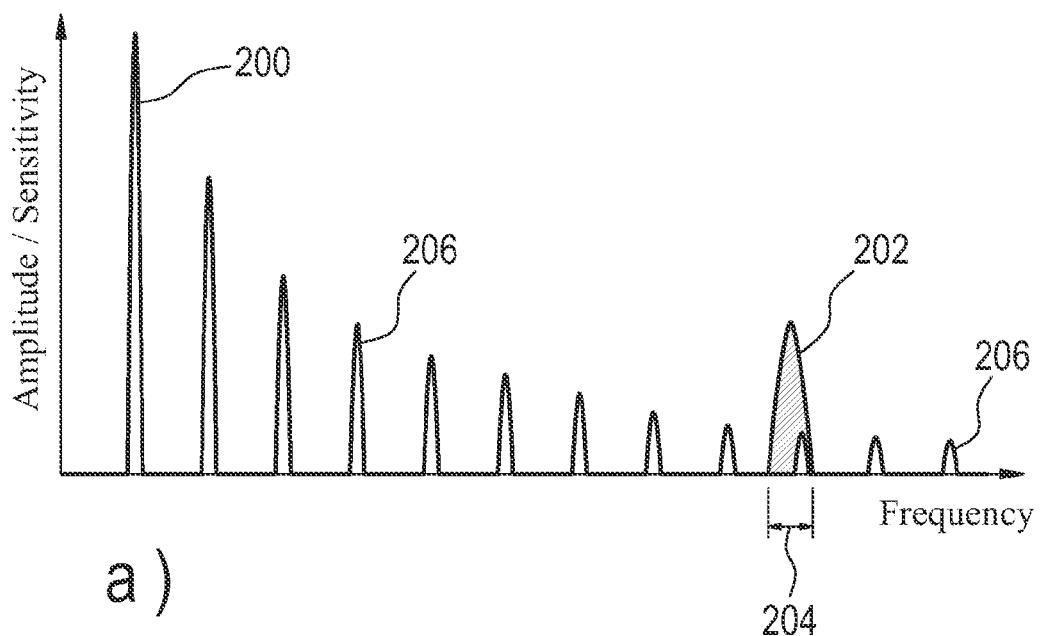
FIG. 2 illustrates the selection scheme of the operating frequency used for the power transfer frequency.
Figure 2:
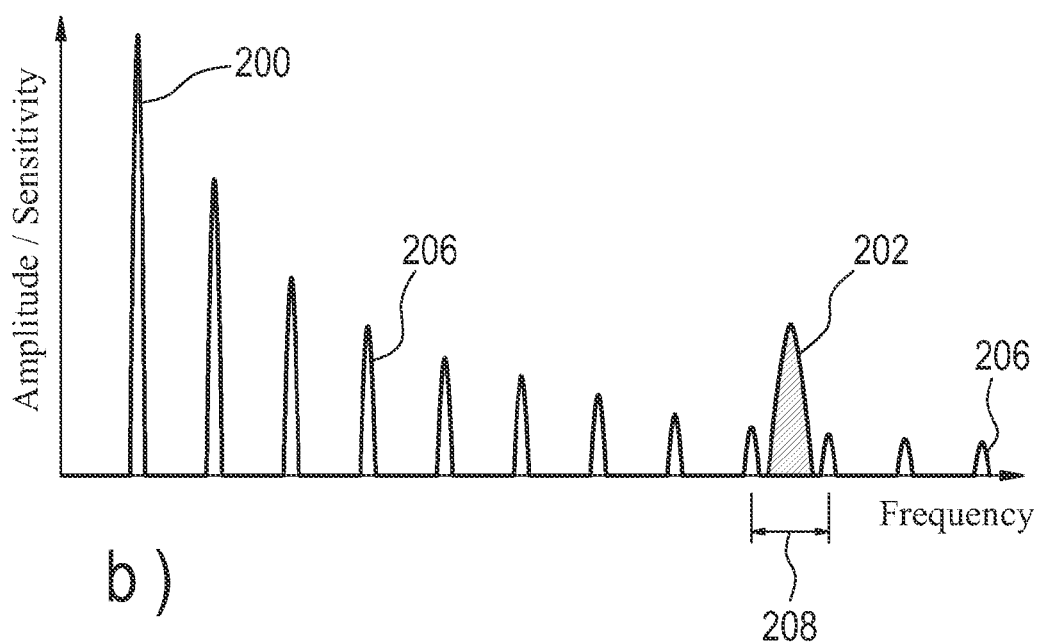

FIG. 2 illustrates the schematic by which the power transfer frequency for inductively supplying the electric power to an electric component, for example a radio frequency receiver coil unit is selected. Shown in FIG. 2a are the amplitudes of the power transfer frequency at the frequency position 200 and the higher harmonics 206 at higher positions in frequency. The higher harmonics do not have a continuous spectrum but discreet peaks. The frequency distance of the peaks is equal to the basic operating frequency at position 200. As shown in FIG. 2a, with an arbitrary power transfer frequency it may happen, that one of the higher harmonic peaks in the range 204 fall exactly into the receiver coil radio frequency band such that unwanted disturbances may occur due to said higher harmonic in the frequency range 204.

In order to avoid this situation, as shown in FIG. 2b the power transfer frequency 200 is selected such that any multiples of this frequency, i.e. the higher harmonics 206 do not fall into the forbidden range 208 which is defined by the receiver coil radio frequency band 202. In this case, the power transfer frequency is selected to be high enough such that the frequency distance of the higher harmonic peaks 206 is larger than the frequency bandwidth 202 of the forbidden band.

Figure 3:
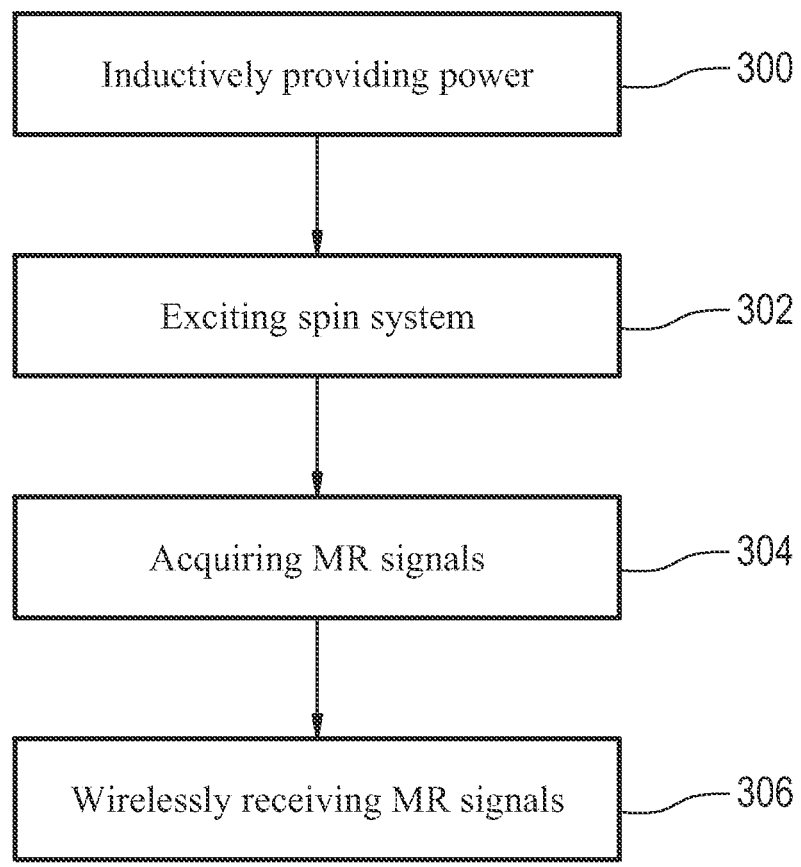
FIG. 3 is a flowchart illustrating a method of performing a nuclear magnetic resonance imaging scan.

FIG. 3 is a flowchart illustrating a method of performing a nuclear magnetic resonance imaging scan of an object. In step 300 power is inductively provided to a receiver coil unit or in general to an electric component preferably comprised with the bore of an MRI magnet. For the case of simplicity, in the following, it is assumed without loss of generality that the electric component is the receiver coil unit itself. In step 302, the spin system is excited whereupon in step 304 MR signals are acquired by the receiver coil unit. Finally, in step 306 the acquired MR signals are wirelessly transmitted and received by the MRI system.

Preferably, the radio frequency receiver coil unit comprises energy storage means such that the steps 300 and the steps 302 or 304 do not have to fall together: in case the step 300 is performed before exciting of the spin system and before acquisition of the MR signals, negative impact of the inductive power transfer on the image quality can be avoided. This is based on the insight that the MRI system in many cases does not always perform measurements of the nuclear resonances. As already described above, during a complete scan there are times when the gradient field changes to a new distribution, wherein at such time slots MR resonant measurements are not performed. These time slots can be used for inductively providing electric power by the nuclear magnetic resonance imaging apparatus to the radio frequency receiver coil unit.

Figure 4:
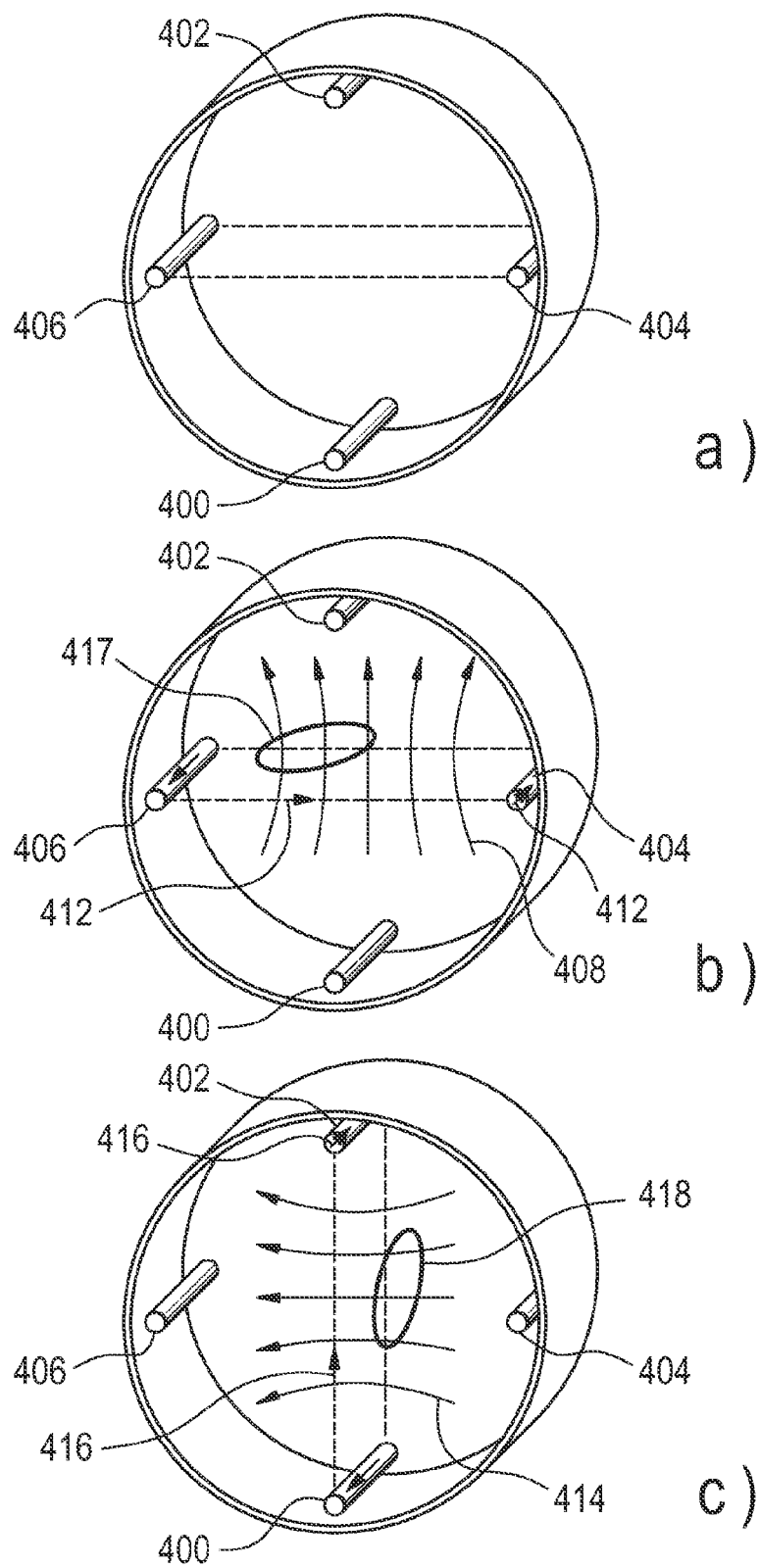
FIG. 4 illustrates an arrangement of power transfer coils.

FIG. 4 illustrates a coil arrangement for inductively supplying electric power to a radio frequency receiver coil unit. As shown in FIG. 4a, two transmitter coils consisting of slabs 400, 402 and 404, 406 are arranged orthogonally to each other. Each coil consists of two slabs (slab 1 denoted by reference numerals 400 and 404 and slab 2 denoted by reference numerals 404 and 406) arranged in parallel to the axis of the MRI system. The slabs are electrically interconnected to achieve closed loops, indicated by the dashed lines.

It has to be noted here, that instead of using only two coils arranged orthogonally to each other also an arbitrary number of coils like for example three, four or five coils can be used. However, in general the windings of each transmitter coil of the set of transmitter coils span a plane, wherein all spanned planes of the set of transmitter coils intersect with a common axis, wherein said axis is in parallel with the cylindrical axis of a main magnet.

In FIG. 4b the operation of the transmitter coil comprising the slabs 404 and 406 is shown. A current 412 is flowing such that the magnetic field lines 408 are generated. In this case, the field lines can penetrate a reception coil 417 which is arranged in parallel with its plane to the plane defined by the coil comprising the slabs 404 and 406.

The same principle holds with respect to the coil comprising the slabs 400 and 402, as depicted in FIG. 4. In this case, a current 416 is flowing which generates magnetic field lines 414 which can penetrate a respective reception coil 418 which again is arranged in parallel with its plane to the plane span by the coil comprising the slabs 400 and 402.

Figure 5:
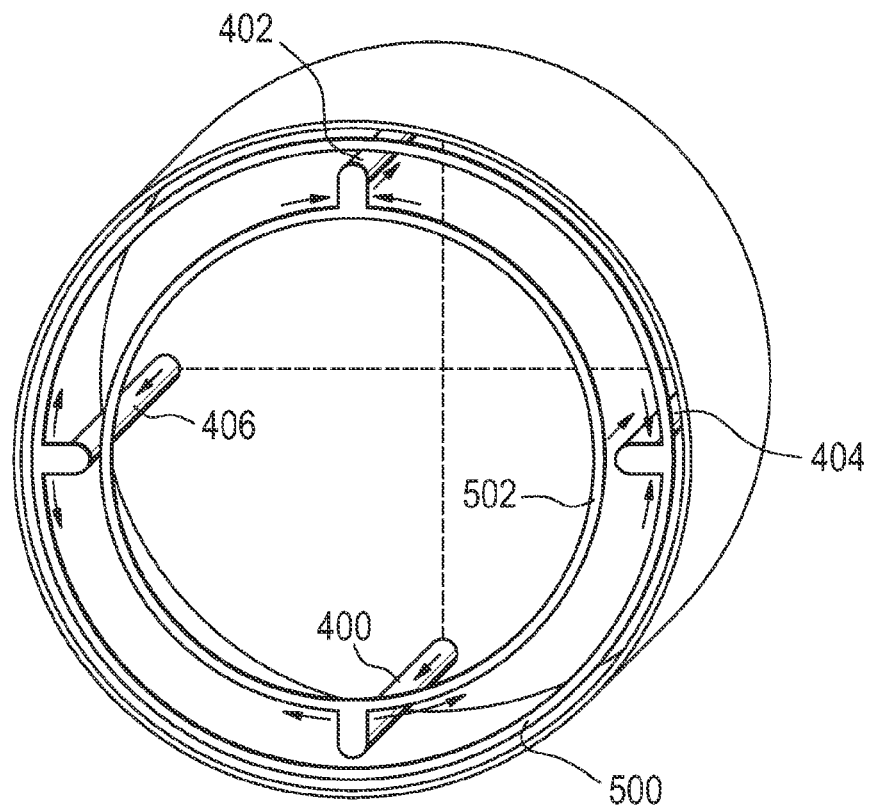
FIG. 5 illustrates an arrangement of power transfer coils.

In FIG. 5, the coil arrangement comprising the slabs 400, 402, 404 and 406 is shown in more detail. On the front side, the slabs 400 and 402 are interconnected by a ring type connector 502. The same holds for the slabs 404 and 406 which are interconnected by a ring type connector 500. Preferably, currents indicated by arrows are alternating and flow in slabs in opposite directions. Furthermore, alternating currents in one transmitter coil are shifted with respect to the other transmitter coil by a phase angle of 90°. If the amplitude of current 1 is maximum, the current 2 has a minimum and vice versa. If current 1 is maximal, the generated magnetic field points radial and in a substantially vertical direction. It induces a voltage in the receiver coil 417, which is the situation depicted in FIG. 4b. At a later point in time, the situation as depicted in FIG. 4c occurs, in which the second current is maximal such that the generated magnetic field points radial and substantially points in horizontal direction. It can induce a voltage in the receiver coil 418.

These figs. show dedicated points in time, where one current is maximum and the other one is zero. However in general, since preferably the applied currents are shifted by a phase angle of 90° and since the applied currents have a sinusoidal shape, the resulting magnetic field points in any radial direction during one period and a receiver coil oriented in an arbitrary manner within the coil arrangement depicted in FIG. 5 can receive power, independently of its orientation.

With respect to FIG. 5 it should be noted that the magnetic fields generated by the currents in the upper and lower half of the ring-type interconnections 500 and 502 connecting the inductor slabs compensate each other to some extent, because the currents flow in the same direction. Therefore, the resulting magnetic field is more or less similar to one of the ideal arrangements depicted in FIGS. 4b and 4c.

Figure 6:
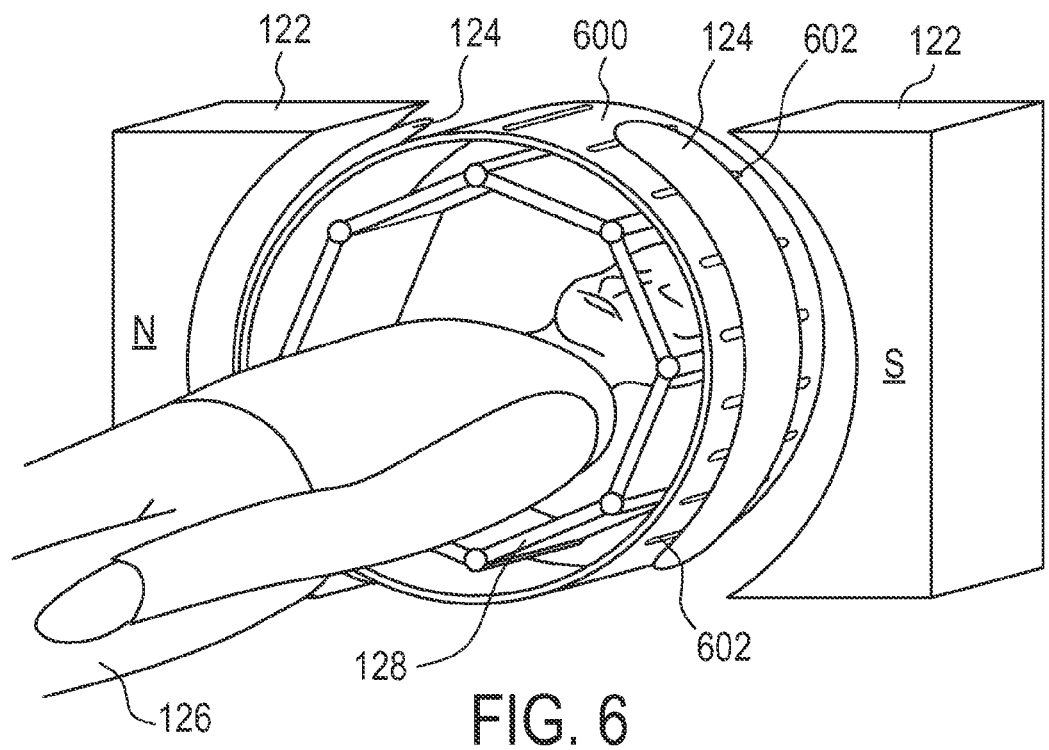
FIG. 6 is a schematic illustrating an MRI system according to the invention.

FIG. 6 depicts a further schematic of an MRI apparatus according to the invention. Shown in FIG. 6 are the main magnet system 122, the gradient coils 124 and the RF transmitter coils 128. In between the RF transmitter coils 128 and the gradient coils 124, a shielding tube 600 is provided. The shielding tube 600 may for example be a copper tube comprising slits 602. The slits 602 are bridged by capacitors not shown here. The purpose as well known in the art of the shielding tube is to confine the RF field generated by the RF transmitter coil 128 within the tube area defined by the shielding tube 600. Nevertheless, due to the presence of the slits 602 magnetic field gradients generated by the gradient coils 124 can penetrate through the slits of the shielding tube 600 and be used for magnetic resonance imaging purposes.

The shielding tube itself exhibits an RF resonance frequency. It is caused by the capacitors bridging the gaps. For induced shielding currents, the un-gapped shield itself appears as an inductivity. The combination of bridging capacitors and shielding inductivity appears as a resonant circuit to induced currents. If the operating frequency of the power transfer system is close to this resonance, extremely high induced currents may appear which would cause losses and reduce drastically the power efficiency. Therefore, the operating frequency is selected to be different from this resonance frequency. Preferably, the operating frequency is selected higher than the resonance frequency. In this frequency regime the capacitors appear as low impedance and thus the shielding function is also effective for the power transfer. This is advantageous because then all equipment outside a shielding tube is not affected by the power magnetic field.

REFERENCE NUMERALS

100 data processing system
102 screen
104 input device
106 memory
108 interface
110 processor
112 computer program product
114 module
116 module
120 module
122 main magnets
124 gradient coils
126 body
128 RF coil
130 main field control unit
132 gradient coils control unit
134 RF control unit
140 inductive power coupling coil
142 sensor
144 RF coil unit
146 wireless reception unit
148 wireless transmission unit
150 energy storage
152 coil
200 power transfer frequency
202 receiver coil radio frequency band
204 range
206 harmonic peaks
208 range
400 slab
402 slab
404 slab
406 slab
408 magnetic field lines
412 current
414 magnetic field lines
416 current
417 coil
418 coil
500 interconnection
502 interconnection
600 shielding tube
602 slits

The invention claimed is:
1. A nuclear magnetic resonance imaging apparatus comprising:

a main magnet adapted for generating a main magnetic field;

at least one radio frequency receiver coil unit for acquiring magnetic resonance signals in a receiver coil radio frequency band from an examined object;

means for inductively supplying electric power to an electric component of the apparatus, wherein the electric component is adapted to be powered by inductively supplied electric power, wherein a power transfer frequency and higher harmonics of the power transfer frequency for inductively supplying the electric power are located outside the receiver coil radio frequency band;

means for determining at least one flanking frequency of actually supplied higher harmonics of the power transfer frequency; and means for adjusting the power transfer frequency using said determined flanking frequency.

2. The apparatus of claim 1, wherein the electric component is the radio frequency receiver coil unit.

3. The apparatus of claim 1, wherein the main magnet comprises a magnet bore, wherein the electric component is spatially located within the magnet bore.

4. The apparatus of claim 1, wherein the power transfer frequency flanks the receiver coil radio frequency band.

5. The apparatus of claim 1, wherein the means for inductively supplying the electric power are adapted for supplying the electric power to the radio frequency receiver coil unit at time slices unused for magnetic resonance signal acquisition by the radio frequency receiver coil unit.

6. The apparatus of claim 1, further comprising a shielding tube, the shielding tube confining a magnetic resonance radio frequency excitation field generated by the at least one radio frequency transmitter coil unit to an examination zone, the examination zone being adapted for receiving the examined object, the shielding tube being further penetrable for magnetic field gradients generated by magnetic field gradient coils located outside the shielding tube, the shielding tube featuring an electrical resonance frequency, wherein the power transfer frequency and the higher harmonics of the power transfer frequency are further located outside the shielding tube resonance frequency.

7. An electric component of a nuclear magnetic resonance imaging apparatus, the apparatus comprising:

a nuclear magnetic resonance imaging receiving coil unit for acquiring magnetic resonance signals in a receiver coil radio frequency band from an examined object, the electric component comprising an inductive reception coil configured to receive electric power, wherein a power transfer frequency and higher harmonics of the power transfer frequency are located outside the receiver coil radio frequency band;

a sensor configured to determine at least one flanking frequency of actually supplied higher harmonics of the power transfer frequency, wherein the power transfer frequency is adjusted using said determined flanking frequency.

8. The electric component unit of claim 7, wherein the means for inductively receiving electric power comprise a first coil adapted for inductively receiving the electric power, wherein the receiving coil unit further comprises a second coil adapted for receiving the magnetic resonance signals, wherein the first and the second coil are overlapping for a mutual electromagnetically decoupling a of the first and second coil.

9. The electric component of claim 7, wherein the means for inductively receiving electric power comprise a set of coils adapted for inductively receiving the electric power, wherein each coil of the set of coils comprise a different number of coil windings.

10. A method of performing nuclear magnetic resonance imaging of an object, the method being performed by a nuclear magnetic resonance imaging apparatus, the method comprising:

exciting nuclear magnetization within the object;

inductively supplying electric power to an electric component of the apparatus, wherein the electric component is powered by inductively supplied electric power, the apparatus comprising a radio frequency receiver coil unit, the radio frequency receiver coil unit being adapted for acquiring magnetic resonance signals in a receiver coil radio frequency band from the object upon excitation of the object, wherein a power transfer frequency and higher harmonics of the power transfer frequency for inductively supplying the electric power are located outside the receiver coil radio frequency band;

receiving the acquired magnetic resonance signals from the receiver coil unit;

determining at least one flanking frequency of actually supplied higher harmonics of the power transfer frequency; and adjusting the power transfer frequency using said determined flanking frequency.

11. A non-transitory computer program product comprising executable instructions that, when executed by a processor, causes the processor to perform the method as claimed in claim 10.

12. A method of acquiring magnetic resonance imaging signals in a receiver coil radio frequency band from an examined object, the method comprising:

inductively receiving electric power, wherein a power transfer frequency and higher harmonics of the power transfer frequency are located outside the receiver coil radio frequency band;

acquiring the magnetic resonance signals from the examined object;

transmitting the acquired magnetic resonance signals to a nuclear magnetic resonance imaging apparatus;

determining at least one flanking frequency of actually supplied higher harmonics of the power transfer frequency; and adjusting the power transfer frequency using said determined flanking frequency.

* * * * *